US011536755B2

(12) United States Patent
Fisk, II et al.

(10) Patent No.: US 11,536,755 B2
(45) Date of Patent: Dec. 27, 2022

(54) SYSTEM AND METHOD FOR ARC DETECTION USING A BIAS RF GENERATOR SIGNAL

(71) Applicant: MKS Instruments, Inc., Andover, MA (US)

(72) Inventors: Larry J. Fisk, II, Fairport, NY (US); Benjamin J. Gitlin, Rochester, NY (US); Mariusz Oldziej, Avon, NY (US); Aaron M. Burry, Ontario, NY (US); Matthew G. Harrington, Campbell, CA (US); Aaron T. Radomski, Conesus, NY (US)

(73) Assignee: MKS Instruments, Inc., Andover, MA (US)

( * ) Notice: Subject to any disclaimer, the term of this patent is extended or adjusted under 35 U.S.C. 154(b) by 442 days.

(21) Appl. No.: 16/887,346

(22) Filed: May 29, 2020

(65) Prior Publication Data

US 2021/0373054 A1 Dec. 2, 2021

(51) Int. Cl.
| | | |
|---|---|---|
| *H01J 37/32* | (2006.01) | |
| *G01R 29/02* | (2006.01) | |
| *G01R 23/16* | (2006.01) | |

(52) U.S. Cl.
CPC .............. *G01R 23/16* (2013.01); *G01R 29/02* (2013.01); *H01J 37/321* (2013.01); *H01J 37/32091* (2013.01); *H01J 2237/24564* (2013.01); *H01J 2237/334* (2013.01)

(58) Field of Classification Search
CPC .......................... H01J 37/321; H01J 37/32091
See application file for complete search history.

(56) References Cited

U.S. PATENT DOCUMENTS

| | | |
|---|---|---|
| 7,602,127 B2 | 10/2009 | Coumou |
| 7,728,602 B2 | 6/2010 | Valcore et al. |
| 7,981,257 B2 | 7/2011 | Krauss et al. |
| 8,110,991 B2 | 2/2012 | Coumou |
| 8,264,237 B2 | 9/2012 | Coumou |
| 8,289,029 B2 | 10/2012 | Coumou |

(Continued)

FOREIGN PATENT DOCUMENTS

| | | |
|---|---|---|
| CN | 102630337 A | 8/2012 |
| KR | 10-2012-0059561 A | 6/2012 |

(Continued)

OTHER PUBLICATIONS

International Search Report and Written Opinion regarding International Application No. PCT/US2021/019322, dated Jun. 15, 2021.

(Continued)

*Primary Examiner* — Joseph L Williams
(74) *Attorney, Agent, or Firm* — Harness, Dickey & Pierce, P.L.C.

(57) ABSTRACT

An arc detector for a RF power supply system, where the RF power supply incudes a first RF power supply and a second RF power supply. A signal applied to a non-linear load varies in accordance with an output from one of the first RF power supply or the second RF power supply. The signal has a frequency. During an arc or arc condition in the non-linear load, the frequency of the signal changes, and if the frequency is outside of a selected range, an arc or arc condition is indicated. The frequency can be determined by digitizing the signal into a series of pulses and measuring a time or period between pulses.

24 Claims, 7 Drawing Sheets

(56) References Cited

U.S. PATENT DOCUMENTS

| | | |
|---|---|---|
| 8,334,700 B2 | 12/2012 | Coumou et al. |
| 8,395,322 B2 | 3/2013 | Coumou |
| 8,519,745 B2 | 8/2013 | Scholder |
| 8,890,537 B2 | 11/2014 | Valcore, Jr. et al. |
| 9,842,726 B2 | 12/2017 | Daniels et al. |
| 10,546,724 B2 | 1/2020 | Radomski et al. |
| 2012/0322270 A1 | 12/2012 | Long et al. |
| 2014/0263199 A1 | 9/2014 | Nelson et al. |
| 2019/0108976 A1 | 4/2019 | Van Zyl |

FOREIGN PATENT DOCUMENTS

| | | |
|---|---|---|
| TW | 200836595 A | 9/2008 |
| TW | 200935988 A | 8/2009 |
| TW | 201503212 A | 1/2015 |
| TW | 201811122 A | 3/2018 |

OTHER PUBLICATIONS

Taiwan Office Action regarding Application No. 110105564, dated Aug. 17, 2022.

SYSTEM AND METHOD FOR ARC DETECTION USING A BIAS RF GENERATOR SIGNAL

FIELD

The present disclosure relates to alternating current (AC) power supply systems and to detecting arcs in a non-linear load by monitoring the output signal of a bias generator.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

SUMMARY

An arc detection system includes a level detector module. The level detector module generates a level signal in accordance with an AC signal applied to a non-linear load. The level signal includes at least one of a first state or a second state in accordance with a magnitude of the AC signal. The arc detection system also includes a timer module. The timer module receives the level signal and generates a timing signal in accordance with a duration of one of the first state or the second state of the level signal, wherein an arc condition in the non-linear load is indicated when the timing signal meets a selected criteria.

A RF power generator system includes a first RF power source, which generates a first RF signal to a non-linear load, a second RF power source, which generates a second RF signal to the load, and an arc detector which receives a sense signal that varies in accordance with the first RF signal. The arc detector determines whether a frequency of the sense signal is one of less than a first selected threshold or greater than a second selected threshold. The arc detector indicates an arc condition when the frequency of the sense signal is one of less than a first selected threshold or greater than a second selected threshold.

A method for detecting an arc in a non-linear load includes detecting an AC signal applied to the load. The method further comprises determining a frequency of the AC signal applied to the load. The method indicates an arc condition or arc if the frequency meets a selected criteria.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
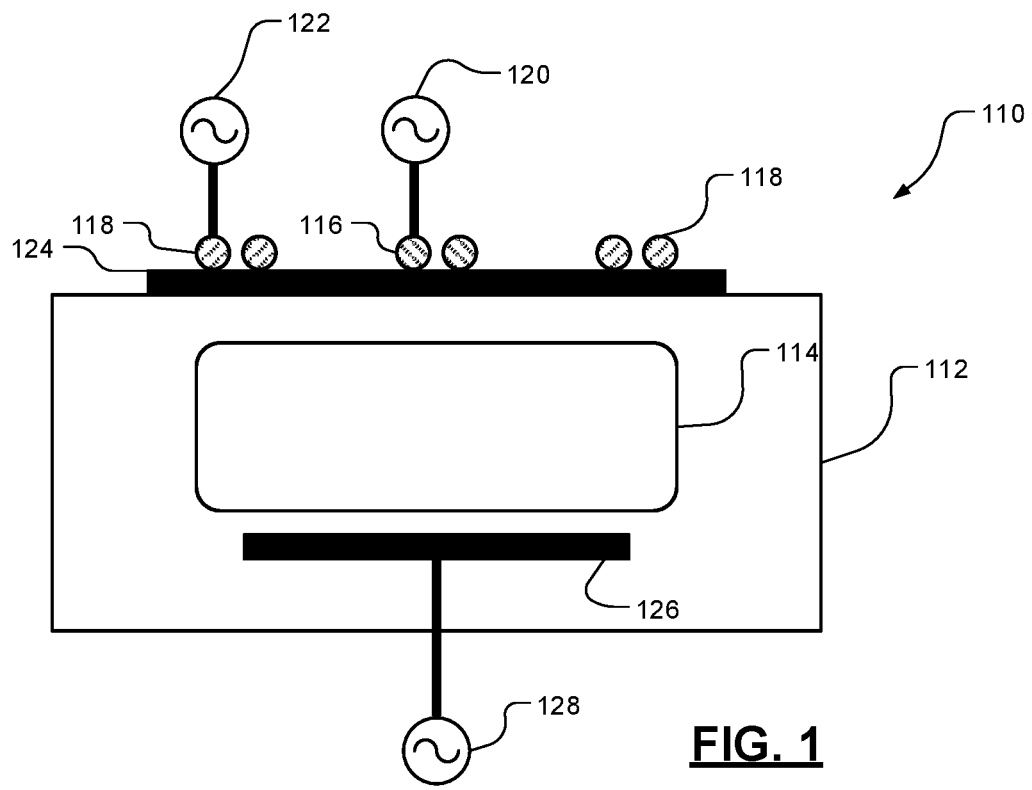
FIG. 1 depicts a representation of an inductively coupled plasma system.

A power system may include a RF power generator, a matching network, and a load (such as a non-linear load, a process chamber, a plasma chamber, or a reactor having a fixed or variable impedance). The power generator generates a RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power"). Forward power may be maximized and reverse power may be minimized when the input impedance of the matching network matches the characteristic impedance of the transmission line.

In the RF power source or power supply field, there are typically two approaches to applying a power signal to the load. A first, more traditional approach is to apply a continuous power signal to the load. In a continuous mode or continuous wave mode, a continuous power signal is typically a constant sinusoidal RF power signal that is output continuously by the power source to the load. In the continuous mode approach, the power signal assumes a constant sinusoidal output, and the amplitude of the power signal and/or frequency (of a RF power signal) can be varied in order to vary the output power applied to the load.

A second approach to applying the power signal to the load involves pulsing an RF signal, rather than applying a continuous RF signal to the load. In a pulse mode of operation, the RF signal is modulated by a modulation signal in order to define an envelope for the modulated power signal. The RF signal may be, for example, a sinusoidal RF signal or other time varying signal. Power delivered to the load is typically varied by varying the modulation signal. The modulation signal may have any number of shapes, including a square wave, a square wave with multiple states of different amplitudes, or other waveform having one or multiple states or portions.

In a typical power supply configuration, output power applied to the load is determined using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include a bias power and/or a source power applied to one or a plurality of electrodes of the load. The source power typically generates a plasma and controls plasma density, and the bias power modulates ions in the formulation of a sheath that contains the plasma. The bias and the source may share the same electrode or may use separate electrodes, in accordance with various design considerations.

When a power delivery system drives a time-varying or non-linear load, such as a process chamber, plasma chamber, or reactor, the power absorbed by the plasma sheath results in a density of ions with a range of ion energy. One characteristic measure of ion energy is the ion energy distribution function (IEDF). The IEDF can be controlled with the bias power. One way of controlling the IEDF for a system in which multiple RF power signals are applied to the load occurs by varying multiple RF signals that are related by frequency and phase. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in their entirety in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding IEDF.

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs.

U.S. patent application Ser. No. 13/834,786, filed Mar. 15, 2013 and entitled Pulse Synchronization by Monitoring Power in Another Frequency Band, assigned to the assignee of the present application and incorporated by reference in its entirety in this application, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

In plasma etching applications in which RF generators provide one or multiple RF signals to a plasma chamber or load, arcing of the plasma sometimes occurs. The causes of arcing in a plasma chamber include contamination or debris on the work services or voltages exceeding acceptable limits. Such arcs can be detrimental to the chuck or wafer in the plasma chamber and can also affect operation of the RF generators supplying power to the plasma chamber. Because arcs occur relatively quickly with respect to typical voltage and current sensing devices and processing, arc detection methods rely on significant speed in order to timely indicate an arc condition.

Present methods of arc detection include monitoring reflected power using voltage/current probes or directional couplers at the source RF generator. The voltage or current probes sense the rate of change of reflected signals, such as reflected voltage, current, or power. In typical RF power delivery systems, the low frequency bias RF generator operates at a relatively low frequency compared to the source RF generator, resulting in the source experiencing relatively high reflected power under conditions when no arc is present. Accordingly, when detecting arcs at the source RF generator, the detection threshold to indicate arc conditions must be set higher in order to avoid false arc indications. Further, such methods can be relatively slow and require complex processing, resulting in an increase in overall cost of the system. Because of the challenges of arc detection, some systems are configured to omit arc detection.

FIG. 1 depicts an exemplary representation of an inductively coupled plasma (ICP) system 110. ICP system 110 includes a non-linear load, such as a reactor, plasma reactor, or plasma chamber 112, which will be referred to interchangeably herein, for generating plasma 114. Power in the form of voltage or current is applied to plasma chamber 112 via a pair of coils, including a coil assembly that in various embodiments includes an inner coil 116 and an outer coil 118. Power is applied to inner coil 116 via a RF power generator or power source 120, and power is applied to outer coil 118 via RF power generator or power source 122. Coils 116 and 118 are mounted to dielectric window 124 that assists in coupling power to plasma chamber 112. A substrate 126 is placed in plasma chamber 112 and typically forms the work piece that is the subject of plasma operations. An RF power generator, power supply, or power source 128 (the terms may be used herein interchangeably) applies power to plasma chamber 112 via substrate 126. In various configurations, the power sources 120, 122 provide a source voltage or current to ignite or generate plasma 114 or control the plasma density. Also in various configurations, power source 128 provides a bias voltage or current that modulates the ions to control the ion energy or ion density of the plasma 114. In various embodiments, power sources 120, 122 are locked to operate at the same frequency, voltage, and current, with fixed or varying relative phases. In various other embodiments, power sources 120, 122 may operate at different frequencies, voltages, and currents, and relative phases.

Figure 2:
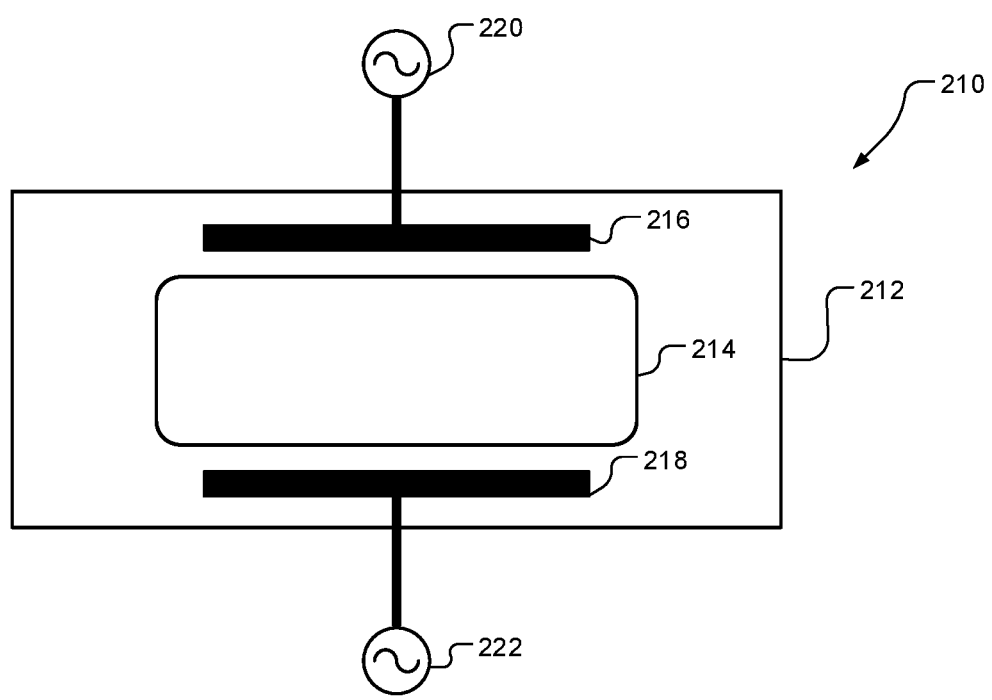
FIG. 2 depicts a representation of a capacitively coupled plasma system.

FIG. 2 depicts an exemplary representation of a capacitively coupled plasma (CCP) system 210. CCP system 210 includes a plasma chamber 212 for generating plasma 214. A pair of electrodes 216, 218 placed within plasma chamber 212 connect to respective RF power generators or power sources 220, 222. In various embodiments, power source 220 provides a source voltage or current to ignite or generate plasma 214 or control the plasma density. In various embodiments, power source 222 provides a bias voltage or current that modulates the ions in the plasma to control the ion energy and/or ion density of the plasma 214. In various RF embodiments, power sources 220, 222 operate at relative phases when the sources are harmonically related. In various other embodiments, power sources 220, 222 operate at different frequencies, voltages, and currents, with fixed or varying relative phases. Also in various embodiments, power sources 220, 222 can be connected to the same electrode, while the counter electrode is connected to ground or to yet a third RF power generator (not shown).

Figure 3:
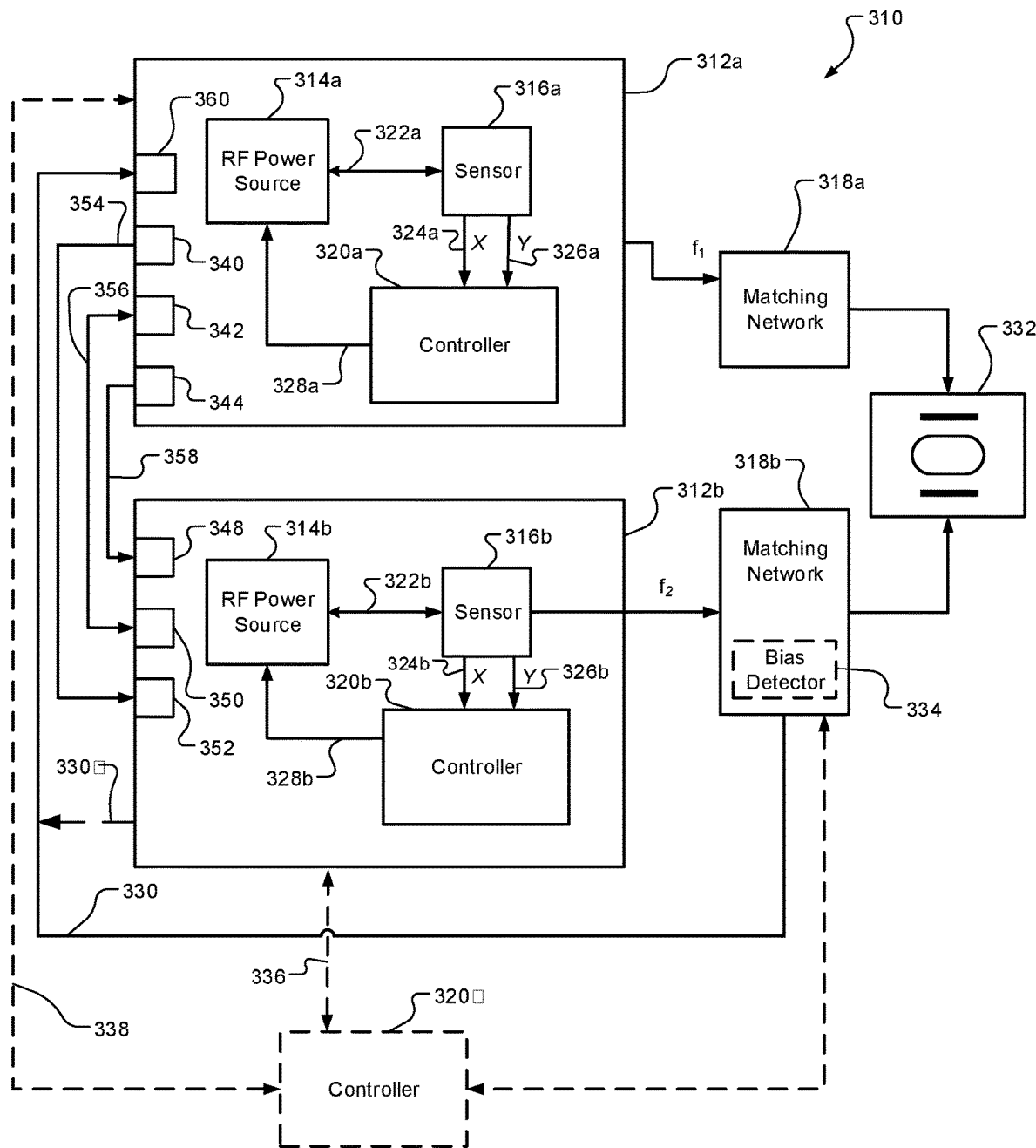
FIG. 3 is a schematic diagram of a power delivery system having multiple power supplies arranged according to various embodiments of the present disclosure.

FIG. 3 depicts a RF generator or power supply system 310. Power supply system 310 includes a pair of radio frequency (RF) generators or power supplies 312a, 312b, matching networks 318a, 318b, and load 332, such as a non-linear load, plasma chamber, process chamber, and the like. In various embodiments, RF generator 312a is referred to as a source RF generator or power supply, and matching network 318a is referred to as a source matching network. Also in various embodiments, RF generator 312b is referred to as a bias RF generator or power supply, and matching network 318b is referred to as a bias matching network. It will be understood that the components can be referenced individually or collectively using the reference number without a letter subscript or a prime symbol.

In various embodiments, source RF generator 312a receives at input port 360 a bias sense link 330 from matching network 318b, bias RF generator 312b, or a bias sense link 330' from bias RF generator 312b. As will be explained in greater detail, bias sense link 330 or 330' is an input signal to source RF generator 312a that indicates one or more operating characteristics or parameters of bias RF generator 312b. In various embodiments, a bias sensor or detector 334 senses the RF signal output from matching network 318b to load 332 and outputs a sensed signal or bias sensor signal via bias sense link 330 to RF generator 312a. In various embodiments, bias sense link 330' may be output from RF generator 312b to RF generator 312a, rather than bias sense link 330. A difference between signals communicated via bias sense links 330, 330' may result from the effect of matching network 318b, which can change the phase between the input signals to and output signals from matching network 318b. In various embodiments, bias sense links 330, 330' communicate information, including the frequency of the RF signal applied to load 332, about the operation of bias RF generator 312b that enables detecting arcs in load 332.

RF generators 312a, 312b include respective RF amplifiers or RF power sources 314a, 314b, sensors 316a, 316b, and processors, controllers, or control modules 320a, 320b. RF power sources 314a, 314b generate respective RF power signals 322a, 322b output to respective sensors 316a, 316b. Sensors 316a, 316b receive the output of RF power sources 314a, 314b and generate respective RF power signals or RF power signals $f_1$ and $f_2$. Sensors 316a, 316b also output signals that vary in accordance with various parameters sensed from load 332. While sensors 316a, 316b, are shown within respective RF power supplies 312a, 312b, sensors 316a, 316b can be located externally to the RF power supplies 312a, 312b. Such external sensing can occur at the output of the RF generator, at the input of an impedance matching device located between the RF generator and the load, or between the output of the impedance matching device (including within the impedance matching device) and the load.

Sensors 316a, 316b detect operating parameters of load 332 and output signals X and Y. Sensors 316a, 316b may include voltage, current, and/or directional coupler sensors. Sensors 316a, 316b may detect (i) voltage V and current I and/or (ii) forward power $P_{FWD}$ output from respective power amplifiers 314a, 314b and/or RF power supplies 312a, 312b and reverse or reflected power $P_{REV}$ received from respective matching network 318a, 318b or load 332 connected to respective sensors 316a, 316b. The voltage V, current I, forward power $P_{FWD}$, and reverse power $P_{REV}$ may be scaled and/or filtered versions of the actual voltage, current, forward power, and reverse power associated with the respective RF power sources 314a, 314b. Sensors 316a, 316b may be analog and/or digital sensors. In a digital implementation, the sensors 316a, 316b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$ Sensors 316a, 316b generate sensor signals X, Y, which are received by respective controllers or power control modules 320a, 320b. Power control modules 320a, 320b process the respective X, Y signals 324a, 326a and 324b, 326b and generate one or a plurality of feedback control signals 328a, 328b to respective RF power sources 314a, 314b. Power sources 314a, 314b adjust the RF power signals 322a, 322b based on the received feedback control signal. In various embodiments, power control modules 320a, 320b may control matching networks 318a, 318b, respectively, via respective control signals 321a, 321b. Power control modules 320a, 320b may include, at least, proportional integral derivative (PID) controllers or subsets thereof and/ or direct digital synthesis (DDS) component(s) and/or any of the various components described below in connection with the modules.

In various embodiments, power control modules 320a, 320b are PID controllers or subsets thereof and may include functions, processes, processors, or submodules. Feedback control signals 328a, 328b may be drive signals and may include DC offset or rail voltage, voltage or current magnitude, frequency, and phase components. In various embodiments, feedback control signals 328a, 328b can be used as inputs to one or multiple control loops. In various embodiments, the multiple control loops can include a proportional-integral-derivative (PID) control loop for RF drive, and for rail voltage. In various embodiments, feedback control signals 328a, 328b can be used in a Multiple Input Multiple Output (MIMO) control scheme. An example of a MIMO control scheme can be found with reference to U.S. Pat. No. 10,546,724, issued Jan. 28, 2020, entitled Pulsed Bidirectional Radio Frequency Source/Load and assigned to the assignee of the present application, and incorporated by reference herein.

In various embodiments, power supply system 310 can include controller 320'. Power control module 320' may be disposed externally to either or both of RF generators 312a, 312b and may be referred to as external or common controller 320'. In various embodiments, controller 320' may implement one or a plurality of functions, processes, or algorithms described herein with respect to one or both of power control modules 320a, 320b. Accordingly, controller 320' communicates with respective RF generators 312a, 312b via a pair of respective links 336, 338 which enable exchange of data and control signals, as appropriate, between controller 320' and RF generators 312a, 312b. For the various embodiments, controllers 320a, 320b, 320' can distributively and cooperatively provide analysis and control of RF generators 312a, 312b. In various other embodiments, controller 320' can provide control of RF generators 312a, 312b, eliminating the need for the respective local power control modules 320a, 320b.

In various embodiments, RF power source 314a, sensor 316a, power control module 320a, and matching network 318a can be referred to as source RF power source 314a, source sensor 316a, source controller 320a, and source matching network 318a. Similarly in various embodiments, RF power source 314b, sensor 316b, controller 320b, and matching network 318b can be referred to as bias RF power source 314b, bias sensor 316b, bias controller 320b, and bias matching network 318b. In various embodiments and as described above, the source term refers to the RF generator that generates a plasma, and the bias term refers to the RF generator that tunes the plasma Ion Energy Distribution Function (IEDF) relative to the bias RF power supply. In various embodiments, the source and bias RF generators operate at different frequencies. In various embodiments, the source RF power supply operates at a higher frequency than the bias RF power supply. In various other embodiments, the source and bias RF generators operate at the same frequencies or substantially the same frequencies.

According to various embodiments, source RF generator 312a and bias RF generator 312b include multiple ports to communicate externally. Source RF generator 312a includes a pulse synchronization output port 340, a digital communication port 342, and an RF output port 344. Bias RF generator 312b includes an RF input port 348, a digital communication port 350, and a pulse synchronization input port 352. Pulse synchronization output port 340 outputs a pulse synchronization signal 354 to pulse synchronization input port 352 of bias RF generator 312b. Digital communication port 342 of source RF generator 312a and digital communication port 350 of bias RF generator 312b communicate via a digital communication link 356. RF output port 344 generates a RF control signal 358 input to RF input port 348. In various embodiments, RF control signal 358 is substantially the same as the RF control signal controlling source RF generator 312a. In various other embodiments, RF control signal 358 is the same as the RF control signal controlling source RF generator 312a, but is phase shifted within source RF generator 312a in accordance with a requested phase shift generated by bias RF generator 312b. Thus, in various embodiments, source RF generator 312a and bias RF generator 312b are driven by substantially identical RF control signals or by substantially identical RF control signal phase shifted by a predetermined amount.

Input port 360 of source RF generator 312a communicates with bias sense link 330 and processes the bias sense signal to determine if an arc exists in load 332. Bias detector 334 generates bias sense signal and communicates the signal on bias sense link 330. In various embodiments, the bias sense signal varies in accordance with the RF signal output by matching network 318b and applied to load 332. Accordingly, the bias sense signal may be a sinusoidal signal having varying frequency, phase, and amplitude in accordance with the RF signal output by bias RF generator 312b. Input port 360 receives signals communicated via bias sense link 330, or bias sense link 330' as described above, and processes bias sense signal to determine whether an arc or arc condition exists in load 332. In various embodiments, processing can occur within matching network 318b or controller 320', or any other controller or processor in power supply system 310, and the determination of whether an arc condition exists in load 332 may be provided to source RF generator 312a or any controller or module in power supply system 310.

Figure 4:
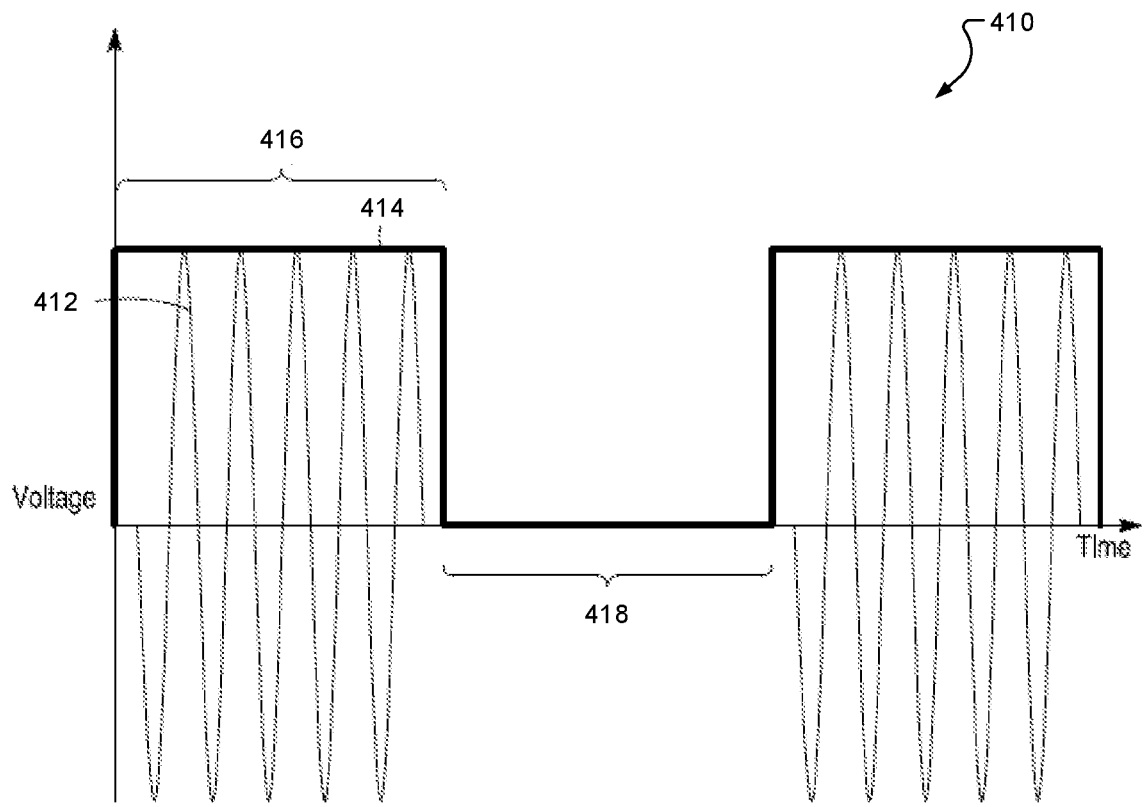
FIG. 4 shows waveforms of a RF signal and a pulse modulating the RF signal.

FIG. 4 depicts a plot 410 of voltage versus time to describe a pulse mode of operation for delivering power to a load, such as load 432 of FIG. 3, from an RF generator. In FIG. 4, a RF signal 412 output by the RF generator is modulated by a pulse signal or pulse 414 indicative of pulsing the RF generator output on and off. As shown at portion 416 of pulse 414, when pulse 414 is on, the RF generator outputs RF signal 412. Conversely, during portion 418 of pulse 414, pulse 414 is off, and the RF generator does not output RF signal 412. Pulse 414 can repeat at a constant duty cycle or a variable duty cycle. Further, pulse 414 need not be embodied as a square wave as shown in FIG. 4.

Further yet, pulse 414 can have multiple portions of varying amplitude and duration. The multiple portions may repeat within a fixed or variable period. It should be understood that the disclosure herein applies to both continuous wave and pulse implementations of a RF generator system.

Figure 5A:
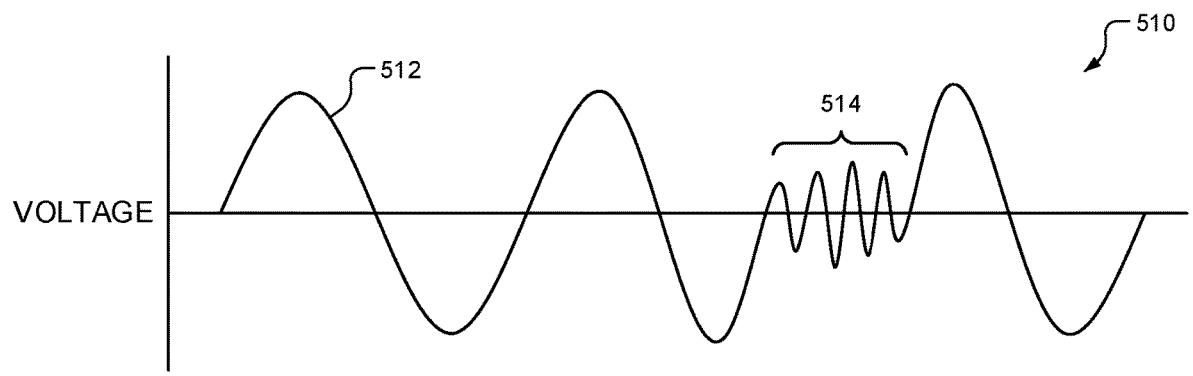
FIGS. 5A-5C depict waveforms for a dual RF generator power delivery system arranged according to the present disclosure.
Figure 5B:
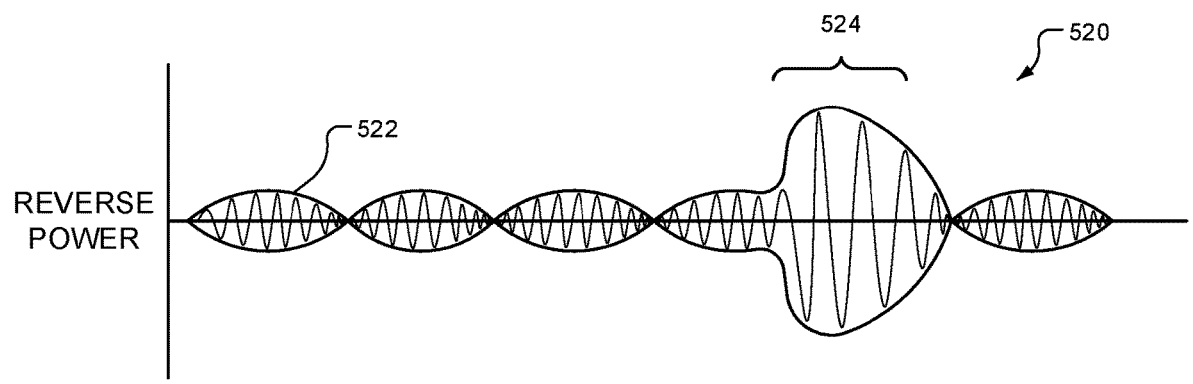
Figure 5C:
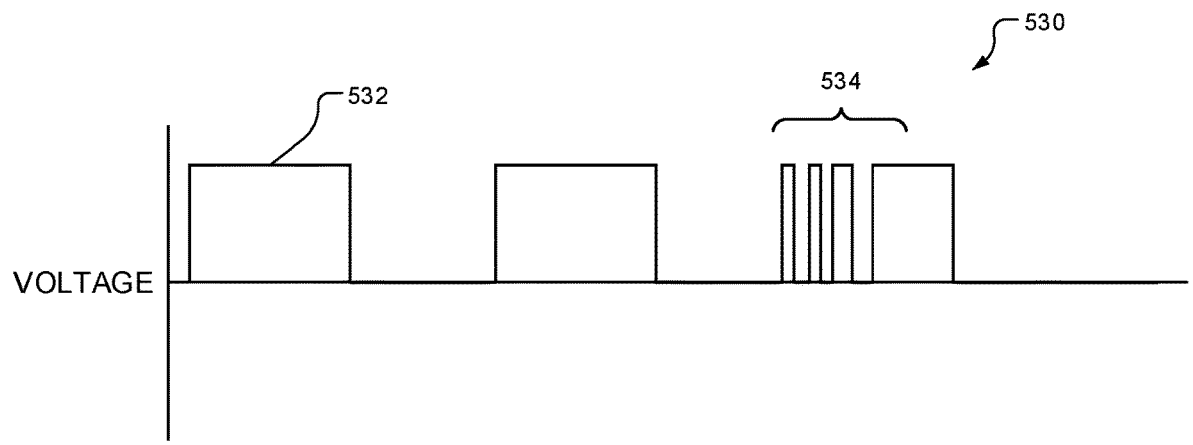

FIGS. 5A-5C depicts waveforms that describe operation of a dual frequency RF power supply system when an arc occurs in the plasma chamber or load driven by the RF power supply system. FIG. 5A depicts a waveform 510 indicating the voltage 512 output from a matching network and applied to a load, such as a voltage output from bias matching network 318b and applied to load 332, as measured by bias detector 334 of FIG. 3, which may be referred to as the post-matching network bias voltage. Voltage 512 is generally shown as a sinusoidal waveform. In region 514 of voltage 512, however, the waveform starts to collapse as a result of an arc in the load 332. Collapse of voltage 512 can result in oscillations of voltage 512, as shown and region 514. A frequency increase accompanies the collapse of voltage 512, so that the frequency of the bias RF signal increases substantially over the nominal or center bias RF frequency. The frequency increase is at least by a factor of two.

The oscillations of voltage 512 of FIG. 5A are accompanied by an increase in the reverse or reflected power at the source RF power supply. FIG. 5B depicts a waveform 520 indicating reflected source power 522 at the source RF power supply, such as source RF generator 312a. The reflected source power 522 of FIG. 5B increases in region 524. Thus, increased reflected power at the source coincides with a collapse of the bias voltage 512, as shown at region 514 of FIG. 5A.

FIG. 5C depicts a waveform 530 indicating a binary signal 532 that varies in accordance with the bias voltage. Binary signal 532 is a binary representation of voltage 512. In region 534 of binary signal 532, the collapse of voltage 512 of FIG. 5A is indicated by a frequency increase in binary signal 532. The frequency increase in voltage 512 and the resultant frequency increase in binary signal 532 can be used to indicate an arc condition in the load, such as load 332 of FIG. 3.

With reference to FIG. 3, bias detector 334 communicates voltage 512 to input port 360. Voltage 512 is processed at source RF generator 312a to generate binary signal 532. As will be described in greater detail herein, binary signal 532 is generated by detecting voltage 512 and converting voltage 512 a binary representation of voltage 512, such as with a zero-crossing detector. The binary representation includes a first state and a second state, where the first state and the second state are defined as a logical high or low, and the portions of voltage 512 are assigned to the first state and the second state in accordance with the magnitude of voltage 512. In other configurations, binary signal 532 is generated using an analog-to-digital converter which receives the bias analog signal and assigns the digital values output by the analog-to-digital converter to either a high state or a low state to generate binary signal 532. The frequency of binary signal 532 is then determined in order to indicate an arc condition. In various embodiments, the high state and the low state may be logical states and need not correspond to a high signal level or a low signal level.

With further reference to FIG. 3, binary signal 532 may be generated at bias detector 334 and communicated to source RF generator 312a via bias sense link 330. In various other embodiments, the frequency of voltage 512 can be determined in any of matching network 318b, bias detector 334, or controller 320 and communicated to source power supply 312a. In various other embodiments, processing voltage 512 can be distributed across one or any number of controllers or processors of power supply system 310.

Figure 6:
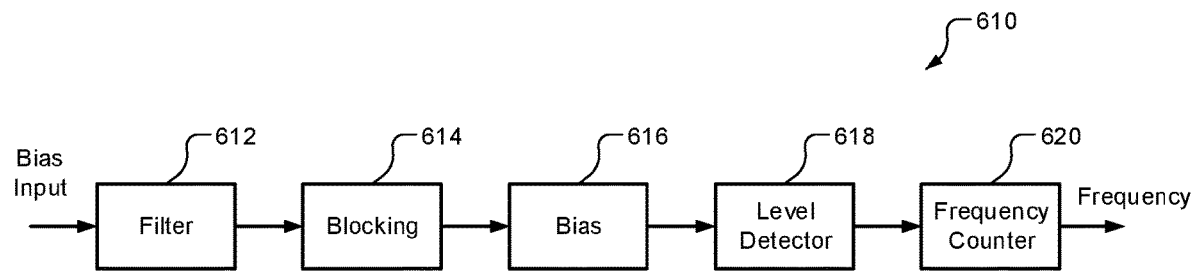
FIG. 6 is a functional block diagram for determining frequency based on an input signal converted to a binary signal according to various embodiments.

FIG. 6 depicts a functional block diagram 610 for determining the frequency of the RF bias signal applied to the load, such as load 332 of FIG. 3. A bias input signal is applied to filter 612. The bias input signal may be, for example, voltage 512 of FIG. 5A. Filter 612 filters out undesirable components, such as components of the RF signal output by source RF generator supply 312a. The filtered signal output by filter 612 is input to blocking network 614 which blocks undesirable current or voltage components from propagating downstream. A bias network 616 receives the output from blocking network 614 and applies a DC bias to the signal. A DC bias may be desirable to implement a zero-crossing function on the signal. A level detector or module 618 receives the biased signal and generates a binary signal or a level signal, such as binary signal 532 of FIG. 5C. The binary signal is input to frequency counter 620, and frequency counter 620 outputs a frequency signal indicating the frequency of the binary signal. In various embodiments, frequency counter 620 is implemented includes a zero-crossing module or function and a timer module or function. In a zero-crossing function, a pulse is output when the binary signal crosses a predetermined value. The time between pulses is determined by the timer function or module and defines the frequency of binary signal 532 and corresponding voltage 512. It will be understood that the block diagram of FIG. 6 includes several functions or modules. The principles of the present disclosure can be implemented with varying subsets of the functions or modules to obtain the frequency of the RF bias signal.

Figure 7:
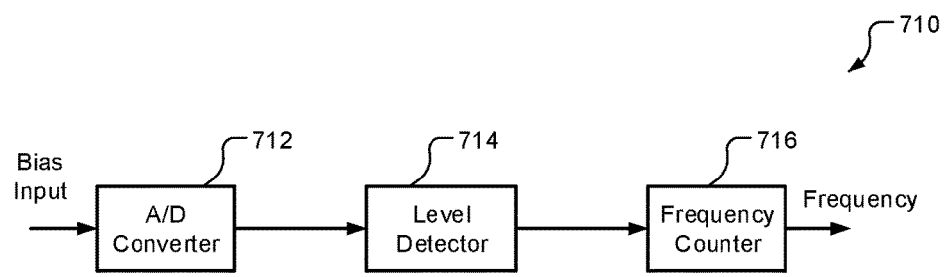
FIG. 7 is a functional block diagram for determining frequency based on an input signal using an analog-to-digital converter.

FIG. 7 depicts a functional block diagram 710 for determining the frequency of the RF bias signal applied to the load, such as load 332 of FIG. 3, using an analog-to-digital converter. A bias input signal is applied to filter analog-to-digital converter (A/D converter) 712. The bias input signal may be, for example, voltage 512 of FIG. 5A. A/D converter 712 converts the analog signal of the bias input signal to digital values. The digital values represent a corresponding analog value of the bias signal. The digital values are input to level detector 714, and level detector 714 generates a level signal by assigning a high state or a low state to each digital value to effectively generate a representation of binary signal 532. For a non-limiting example, if A/D converter 712 outputs digital values from a set of digital values in a range of 0-255, values 0-127 define a first set of digital values and may be assigned to a low state and values 128-255 define a second set of digital values and may be assigned a high state, or the opposite assignment can be selected. Thus, digital value 127, or digital value 128, is considered a level threshold for assigning high and low states. The binary signal is input to frequency counter 716, and frequency counter 716 outputs a frequency of the binary signal. In various embodiments, frequency counter 716 is implemented as a zero-crossing function as described above. It will be understood that the block diagram of FIG. 7 includes several functions or modules. The principles of the present disclosure can be implemented with varying subsets of the functions or modules of FIGS. 6 and 7 in order to obtain the frequency of the RF bias signal. In one non-limiting example, a filter arranged at the output of A/D convert 712 can be configured to block undesirable signal components, such as signal components output by source matching network 318a to load 332 of FIG. 3

In various other embodiments, the output of A/D converter 712 of FIG. 7 can be input to a Fast Fourier Transform (FFT) function or module, and the FFT determines the frequency of the bias input. Once the frequency is determined, the frequency can be used to determine the occurrence of an arc or arc condition in the load. In various other embodiments, any of a number of other approaches can be used to determine the frequency of the bias input, such as the determined frequency can be compared to a threshold or boundary range to determine the occurrence of an arc or arc condition in the load. In various other embodiments, an arc or arc condition in the load may be determined by determining a frequency of voltage 512, and such a determination can be made without conversion of voltage 512 to a binary signal as described in FIGS. 6 and 7.

Figure 8:
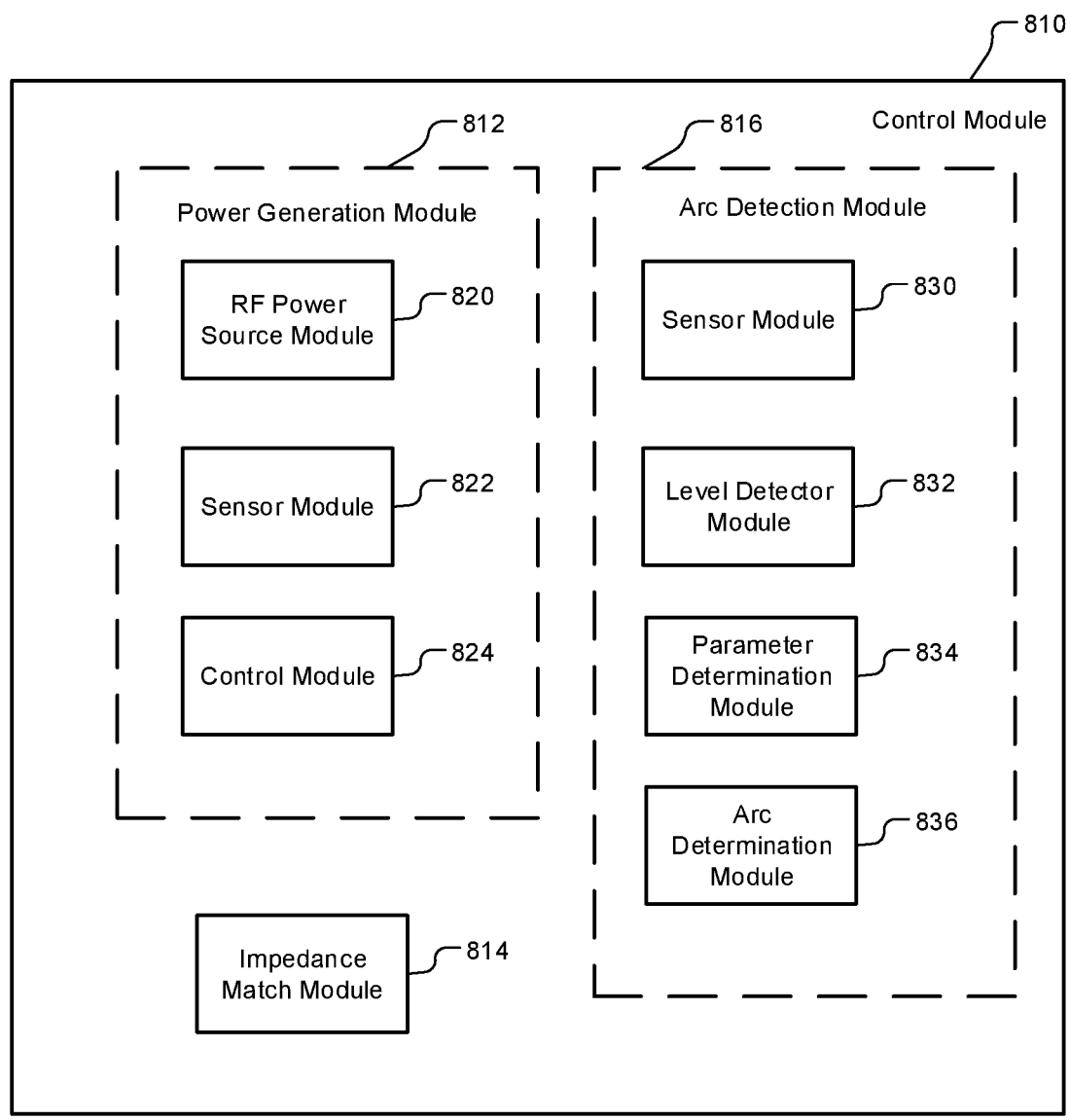
FIG. 8 depicts a functional block diagram of an example control module arranged in accordance with various embodiments.

FIG. 8 shows a control module 810. Control module 810 incorporates various components of FIGS. 1-7. Control module 810 may include power generation control module section 812, impedance match module section 814, and arc detection module section 816. Power generation control module section 812 includes RF power module 820, sensor module 822, and control module 824. Power generation control module section 812 is a generalized representation RF generators 312, described above. Arc detection module section 816 includes sensor module 830, digitization module 832, parameter determination module 834, and arc determination module 836. In various embodiments, control module 810 includes one or a plurality of processors that execute code associated with the module sections or modules 810, 812, 814, 816, 820, 822, 824, 830, 832, 834, and 836. Operation of the module sections or modules 810, 812, 814, 816, 820, 822, 824, 830, 832, 834, and 836 is described below with respect to the method of FIG. 9.

Figure 9:
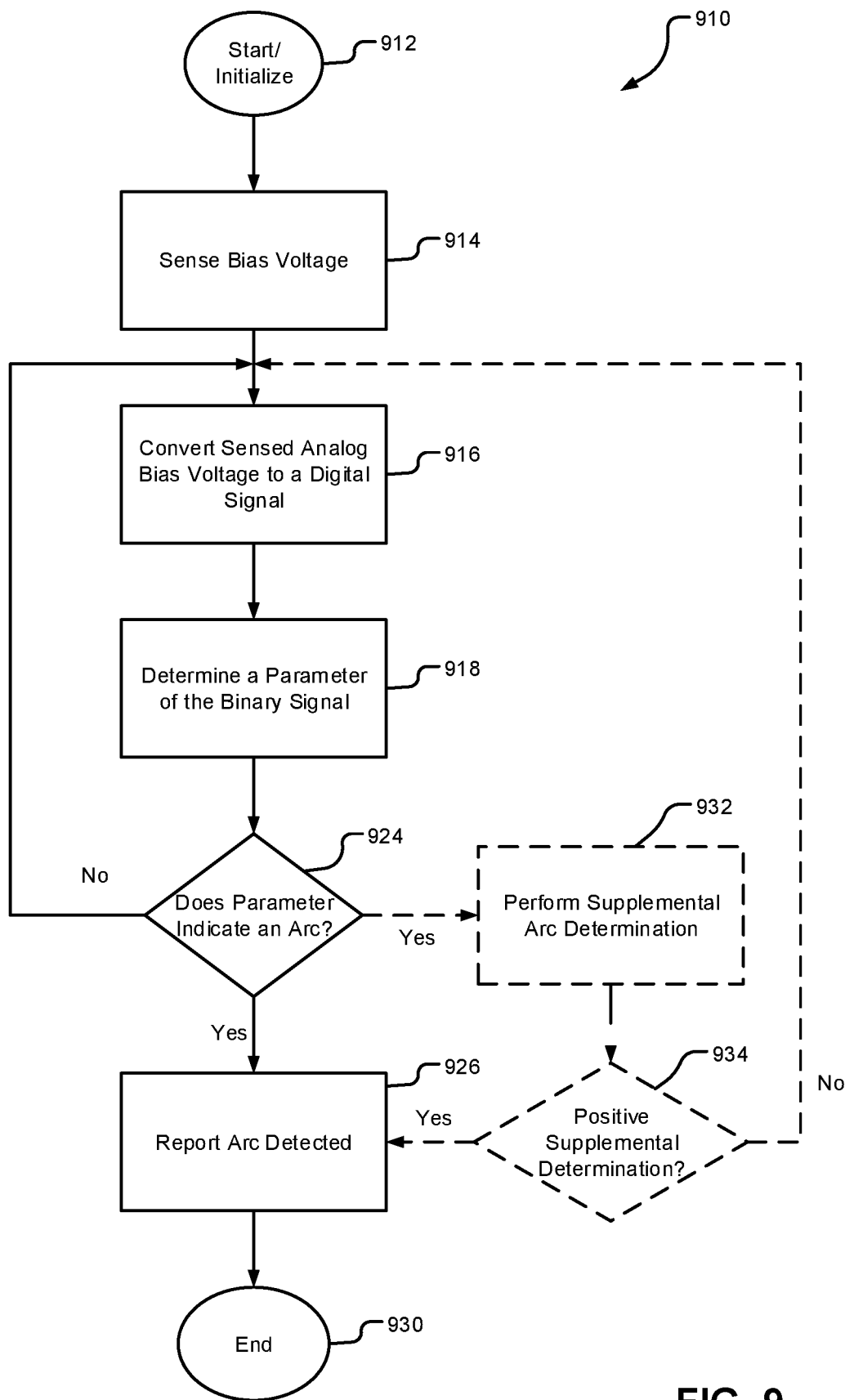
FIG. 9 depicts a flow chart of operation of a control system arranged in accordance with the principals of the present disclosure.

For further defined structure of power control modules 320a, 320b, and 320' of FIG. 3, see the below provided flow chart of FIG. 9 and the below provided definition for the term "module". The systems disclosed herein may be operated using numerous methods, examples, and various control system methods of which are illustrated in FIG. 9. Although the following operations are primarily described with respect to the implementations of FIG. 4, the operations may be easily modified to apply to other implementations of the present disclosure. The operations may be iteratively performed. Although the following operations are shown and primarily described as being performed sequentially, one or more of the following operations may be performed while one or more of the other operations are being performed.

FIG. 9 shows a flow chart of a control system 910 for performing arc detection for, for example, the power delivery systems of FIG. 4. Control begins at block 912 and advances to block 914 which senses the bias voltage, such as voltage 512 of FIG. 5A. Control proceeds to block 916 where the bias voltage is converted to a digital signal. In various embodiments the digital signal may be a binary signal, as described above with respect to FIGS. 6 and 7. In various other embodiments, the digital signal may be other than a binary signal, such as when digital values output by an A/D converter are not converted to a binary representation. Block 918 determines a parameter of the digital signal. In various embodiments, the parameter may be frequency, as described above with respect to FIGS. 6 and 7. In various other embodiments, the parameter may be other than frequency. In one non-limiting example, the parameter may be deviation from a nominal pulse shape, such as one or a number of pulses or pulse widths being within a selected range or outside a selected range.

Block 924 determines if the parameter indicates an arc or an arc condition. The determination occurs in accordance with the parameter meeting a determined or selected criteria. In various embodiments, if the selected criteria is not met, an arc or arc condition does not exist and control returns to block 916. If the selected criteria is met, an arc or arc condition exists and control proceeds to block 926. In various embodiments, the selected criteria includes, but is not limited to, whether the parameter is greater than a selected threshold or whether the parameter is less than a selected threshold. In various other embodiments, the selected criteria includes, but is not limited to, whether the parameter is within a range or whether the parameter is outside of a range.

At block 926, an arc is reported. An arc condition or arc can be reported to any or all of controllers 320 and arc mitigation can occur in response to the reporting of an arc. In various embodiments, an arc or arc condition can be indicated to a controller, and power of the RF output signals generated by RF generators 312 may be adjusted, such as lowered or turned off to extinguish or quench the arc. Mitigation can also include generating an alert to controllers 320 for further investigation and logging the error event.

In various embodiments, additional arc detection can be effected to confirm the frequency-based arc detection described above. the additional arc occurs by comparing supplemental parameters with supplemental criteria. With reference to FIGS. 5A-5C, in various embodiments, reflected source power 522 at the source RF power supply can be used to confirm or supplement the frequency-based arc detection. For example, if the frequency-based arc detection described above indicates an arc, controller 320 of FIG. 3 can query the reflected source power 522 to determine if reflected source power, the supplemental parameter, has increased beyond a selected threshold or boundary, the supplemental criteria, such as in region 524. If an increase in reflected source power 522 beyond the selected boundary is detected, an arc is confirmed. If an increase in reflected source power 522 is not beyond the selected boundary, an arc is not confirmed. In addition to reflected source power 522, other system parameters can be considered as supplemental parameters for arc confirmation. These parameters include reflected power at the bias RF power supply, or the reflection coefficient at the source RF power supply or the bias RF power supply. Other supplemental methods of arc determination can include the systems and methods described in U.S. Pat. Nos. 7,728,602; 8,264,237; 8,289,029; and 8,334,700; all assigned to the assignee of the present application and incorporated by reference in their entirety in this application.

Returning to block 924, in various embodiments, if the frequency is outside of selected boundary or threshold, control proceeds to block 932. At block 932, supplemental arc determination is carried out using the parameters described above. At block 934, if the supplemental determination does not confirm the frequency-based determination, control proceeds to block 916. If the supplemental determination confirms the frequency-based determination, control proceeds to block 926 and an arc or arc condition is indicated as described above. Control then proceeds to block 930 and the process terminates.

The systems and methods described herein facilitate arc detection because it is not necessary to rely on the magnitude of reflected power as a primary detection parameter. Consequently, there is no need for reliance on external voltage/current probes or directional couplers and the complicated processing to indicate the presence of an arc using such probes or couplers. The present disclosure also provides a significant speed increase and can leverage existing generator configurations.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase at least one of A, B, and C should be construed to mean a logical (A OR B OR C), using a non-exclusive logical OR, and should not be construed to mean "at least one of A, at least one of B, and at least one of C." The term subset does not necessarily require a proper subset. In other words, a first subset of a first set may be coextensive with (equal to) the first set.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2016 (also known as the WIFI wireless networking standard) and IEEE Standard 802.3-2015 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Swift, Haskell, Go, SQL, R, Lisp, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. An arc detection system comprising:
   a level detector module configured to generate a level signal in accordance with an AC signal applied to a non-linear load, wherein the level signal includes at least one of a first state or a second state in accordance with a magnitude of the AC signal; and
   a timer module configured to receive the level signal and to generate a timing signal in accordance with a duration of one of the first state or the second state of the level signal,
   wherein an arc condition in the non-linear load is indicated when the timing signal meets a selected criteria.

2. The arc detection system of claim 1 wherein the selected criteria is met when the timing signal is at least one of less than a first threshold or greater than a second threshold.

3. The arc detection system of claim 1 wherein the AC signal is generated by a first RF power supply.

4. The arc detection system of claim 1 wherein the level detector module is configured to convert the AC signal from an analog signal to a binary signal and the binary signal includes the first state and the second state, wherein the first state or the second state occurs when the magnitude of the AC signal is one of greater than or less than a level threshold and the second state occurs when the magnitude of the AC signal is an other of greater than or less than the level threshold.

5. The arc detection system of claim 1 wherein the level detector module comprises a circuit receiving the AC signal and generating the level signal in accordance with the AC signal and the circuit includes a zero-crossing detector.

6. The arc detection system of claim 1 wherein the level detector module comprises an analog-to-digital converter configured to receive the AC signal and convert the AC signal to a plurality of digital values in accordance with the magnitude of the AC signal, wherein a first plurality of the digital values defines the first state and a second plurality of the digital values defines the second state.

7. The arc detection system of claim 1 further comprising:
   a first power source generating the AC signal; and
   a second power source generating a second AC signal applied to the non-linear load,
   wherein the arc condition is indicated in accordance with power reflected from the non-linear load to the second power source and the timing signal.

8. The arc detection system of claim 7 wherein:
   the AC signal is a first RF signal and the second AC signal is a second RF signal, and
   the first RF signal and the second RF signal are one of same frequencies or different frequencies.

9. The arc detection system of claim 1 wherein the non-linear load is a plasma chamber.

10. The arc detection system of claim 1 wherein the AC signal operates at a first frequency, and the AC signal operates at a second frequency during the arc condition, and the second frequency is at least double the first frequency.

11. A RF power generator system comprising:
    a first RF power source configured to generate a first RF signal to a non-linear load;
    a second RF power source configured to generate a second RF signal to the load; and
    an arc detector configured to receive a sense signal that varies in accordance with the first RF signal, the arc detector further configured to:
      determine whether a frequency of the sense signal is one of less than a first selected threshold or greater than a second selected threshold; and
      indicate an arc condition when the frequency of the sense signal is one of less than the first selected threshold or greater than the second selected threshold.

12. The RF power generator system of claim 11 wherein the arc detector further comprises:
    a level detector configured to receive the sense signal and to generate a level signal in accordance with the sense signal, wherein the level signal is assigned to at least one of a first state or a second state in accordance with a magnitude of the first RF signal; and
    a counter configured to receive the level signal and to generate a frequency signal in accordance with a duration of at least one of the first state or the second state, wherein the frequency signal varies in accordance with the frequency of the sense signal, and wherein the frequency of the sense signal varies in accordance with the frequency of the first RF signal.

13. The RF power generator system of claim 11 wherein the arc detector further comprises:
   a filter configured to receive the sense signal and filter out at least a portion of components from the second RF signal to generate a filtered signal;
   a level detector configured to receive the sense signal and to generate a level signal in accordance with the sense signal, wherein the level signal is assigned to at least one of a first state or a second state in accordance with a magnitude of the first RF signal; and
   a counter configured to receive the level signal and to generate a frequency signal in accordance with a duration of at least one of the first state or the second state, wherein the frequency signal varies in accordance with the frequency of the sense signal, and wherein the frequency of the sense signal varies in accordance with the frequency of the first RF signal.

14. The RF power generator system of claim 13 wherein the level detector is configured to convert the first RF signal from an analog signal to a binary signal and the binary signal includes the first state and the second state, wherein one of the first state is assigned when the magnitude of the first RF signal is one of greater than or less than a level threshold and the second state is assigned when the magnitude of the first RF signal is an other of greater than or less than the level threshold.

15. The RF power generator system of claim 11 wherein the arc detector further comprises:
   an analog-to-digital converter configured to receive the sense signal and to output a digital signal that varies in accordance with a magnitude of the sense signal; and
   a counter configured to receive the digital signal and determine a period of a portion of the sense signal in accordance with the digital signal, wherein the period of the portion of the sense signal varies in accordance with the frequency of the digital signal, and wherein the frequency of the sense signal varies in accordance with the frequency of the first RF signal.

16. The RF power generator system of claim 11 wherein the frequency of the frequency of the sense signal is determined using a Fast Fourier Transform (FFT).

17. A method for detecting an arc in a non-linear load, comprising:
   detecting an AC signal applied to the load;
   determining a frequency of the AC signal applied to the load; and
   indicating an arc condition if the frequency meets a selected criteria.

18. The method of claim 17 wherein the selected criteria is met when the frequency is at least one of less than a first threshold or greater than a second threshold.

19. The method of claim 17 wherein determining the frequency further comprises:
   converting a sensed signal that varies in accordance with the AC signal to a digital signal, wherein the digital signal includes one of a pair of states or a plurality of states, and wherein and the plurality of states are assigned into one or another of the pair of states; and
   determining a duration of at least one of the pair of states in order to determine the frequency of the AC signal applied to the load.

20. The method of claim 17 wherein determining the frequency further comprises:
   converting a sensed signal that varies in accordance with the AC signal to a binary signal, wherein the binary signal includes a pair of states; and
   determining a duration of at least one of the pair of states in order to determine the frequency of the AC signal applied to the load,
   wherein the converting further includes using applying the sensed signal to a zero-crossing detector.

21. The method of claim 17 wherein if the frequency meets the selected criteria, comparing supplemental arc indicating parameters against selected supplemental arc indicating criteria in order to determine whether the comparing further indicates the arc condition.

22. The method of claim 17 wherein a first power source generates the AC signal and a second power source generates a second AC signal, further comprising:
   comparing a parameter associated with the second power source to a second selected criteria; and
   indicating the arc condition in accordance with the frequency meeting the selected criteria and the comparing the parameter associated with the second power source to the second selected criteria.

23. The method of claim 17 wherein determining the frequency further comprises:
   converting a sensed signal that varies in accordance with the AC signal to digital values using an analog-to-digital converter, wherein a first set of digital values defines a first state and a second set of digital values defines a second state; and
   determining a duration of at least one of the first state and the second state in order to determine the frequency of the AC signal applied to the load.

24. The method of claim 17 wherein determining the frequency of the AC signal applied to the load further comprises using a Fast Fourier Transform (FFT) function.

* * * * *